(12) United States Patent
Xu et al.

(10) Patent No.: US 10,756,491 B2
(45) Date of Patent: Aug. 25, 2020

(54) ELECTRICAL CONNECTOR HAVING MATING TONGUE EQUIPPED WITH PCB PROTECTIVELY WITHIN METALLIC ENCLOSURE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Yin-Chao Xu, Kunshan (CN); Wei Zhong, Kunshan (CN); Jian-Kuang Zhu, Kunshan (CN)

(73) Assignees: FOXCONN (KUNSHAN) COMPUTER CONNECTOR CO., LTD, Kunshan (CN); FOXCONN INTERCONNECT TECHNOLOGY LIMITED, Grand Cayman (KY)

(\*) Notice: Subject to any disclaimer, the term of this patent is extended or adjusted under 35 U.S.C. 154(b) by 4 days.

(21) Appl. No.: 16/209,987

(22) Filed: Dec. 5, 2018

(65) Prior Publication Data

US 2019/0173234 A1 Jun. 6, 2019

(30) Foreign Application Priority Data

Dec. 6, 2017 (CN) .......................... 2017 1 1274194

(51) Int. Cl.
*H01R 13/6585* (2011.01)
*H01R 13/6596* (2011.01)
(Continued)

(52) U.S. Cl.
CPC ....... *H01R 13/6585* (2013.01); *H01R 12/721* (2013.01); *H01R 13/502* (2013.01);
(Continued)

(58) Field of Classification Search
CPC .................. H01R 13/6585; H01R 13/6658; H01R 24/60; H01R 12/721; H01R 13/502;
(Continued)

(56) References Cited

U.S. PATENT DOCUMENTS 9,231,319 B2\* 1/2016 Qian .................... H01R 13/504
9,257,801 B2\* 2/2016 Fang ................... H01R 13/6587
(Continued)

FOREIGN PATENT DOCUMENTS

CN 202997098 U 6/2013
CN 104425995 B 1/2017

*Primary Examiner* — Travis S Chambers
(74) *Attorney, Agent, or Firm* — Wei Te Chung; Ming Chieh Chang

(57) ABSTRACT

An electrical connector includes a metallic shell and a PCB enclosed within the shell. The shell includes a base and a tongue section forwardly extending from the base, and a receiving space extending along the front-to-back direction from the base into the tongue section. The tongue section forms a pair of opposite mating faces with a plurality of openings therein to communicate with the receiving space. A plurality of ribs are formed between every adjacent openings and extend rearwardly into the receiving space in the front-to-back direction. The printed circuit board forms a plurality of notches in a front edge region to receive the corresponding ribs, respectively.

20 Claims, 6 Drawing Sheets

(51) Int. Cl.
    *H01R 13/66*     (2006.01)
    *H01R 13/502*     (2006.01)
    *H01R 12/72*     (2011.01)
    *H05K 1/00*     (2006.01)
    *H01R 24/60*     (2011.01)
    *H01R 13/6597*     (2011.01)
    *H01R 107/00*     (2006.01)
    *H01R 12/79*     (2011.01)

(52) U.S. Cl.
    CPC ..... *H01R 13/6596* (2013.01); *H01R 13/6597* (2013.01); *H01R 13/66* (2013.01); *H01R 13/6658* (2013.01); *H01R 24/60* (2013.01); *H05K 1/00* (2013.01); *H01R 12/79* (2013.01); *H01R 2107/00* (2013.01)

(58) Field of Classification Search
    CPC .... H01R 13/66; H01R 13/6596; H01R 12/79; H01R 2107/00; H01R 13/6581; H01R 13/6587; H01R 13/6591; H01R 13/6592; H01R 13/6597; H01R 13/6588; H01R 12/59; H05K 1/00
    USPC ............. 439/607.01, 607.41, 607.46, 607.49
    See application file for complete search history.

(56) References Cited

U.S. PATENT DOCUMENTS

| | | | |
|---|---|---|---|
| 9,755,369 B2* | 9/2017 | Huang | H01R 13/6581 |
| 10,038,286 B2* | 7/2018 | Zhu | H01R 13/6658 |
| 2015/0126068 A1* | 5/2015 | Fang | H01R 13/6587 |
| | | | 439/607.23 |
| 2016/0285207 A1* | 9/2016 | Huang | H01R 13/6581 |

* cited by examiner

ELECTRICAL CONNECTOR HAVING MATING TONGUE EQUIPPED WITH PCB PROTECTIVELY WITHIN METALLIC ENCLOSURE

BACKGROUND OF THE DISCLOSURE

1. Field of the Disclosure

The present disclosure relates to an electrical connector having a mating tongue, and particularly to the electrical connector having a mating tongue formed by a metallic enclosure with a PCB (Printed Circuit Board) therein.

2. Description of Related Arts

U.S. Pat. No. 9,257,801 discloses an electrical connector having a mating tongue equipped with an metallic enclosure receiving the contact module therein. Notably, manufacturing such an electrical connector may be relatively complicate and require the strict tolerance.

An improved electrical connector is desired.

SUMMARY OF THE DISCLOSURE

An object of the invention is to provide an electrical connector with a metallic shell and a PCB enclosed within the shell. The shell includes a base and a tongue section forwardly extending from the base, and a receiving space extending along the front-to-back direction from the base into the tongue section. The tongue section forms a pair of opposite mating faces with a plurality of openings therein to communicate with the receiving space. A plurality of ribs are formed between every adjacent openings and extend rearwardly into the receiving space in the front-to-back direction. The printed circuit board forms a plurality of notches in a front edge region to receive the corresponding ribs, respectively, and a plurality of conductive pads on the front edge region exposed to an exterior through the corresponding openings for mating with a complementary connector. An FPC (flexible printed circuit) is mechanically and electrically connected to a rear side of the PCB. The PCB is secured to the shell via soldering between the shell and the grounding pads thereof.

During assembling, the PCB is forwardly inserted into the receiving space from a rear side of the base until the notches receive the corresponding ribs, respectively. The shell and the PCB are secured to each other via soldering between the shell and the grounding pads on the PCB. An insulative bar is attached to a front edge of the tongue section.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
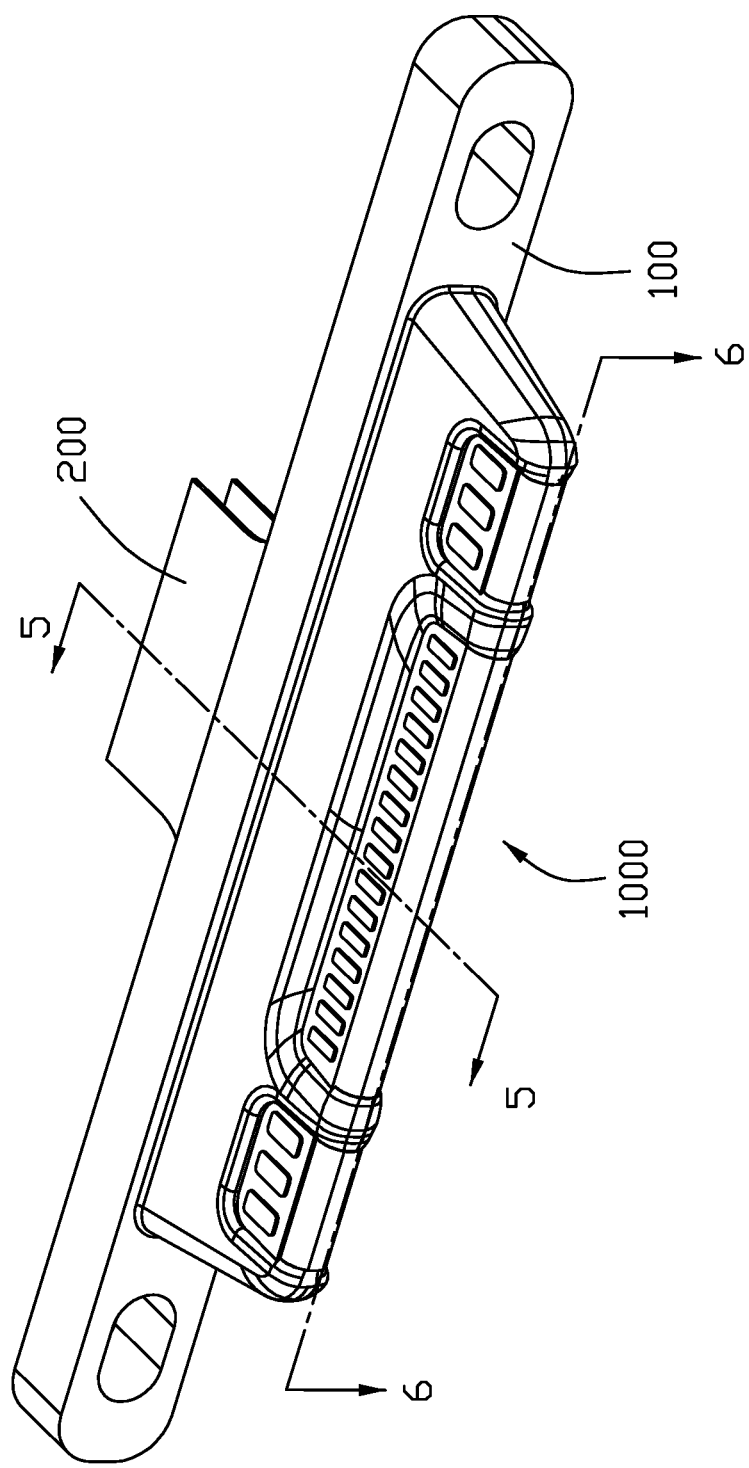
FIG. 1 is a perspective view of an electrical connector of the invention.
Figure 2:
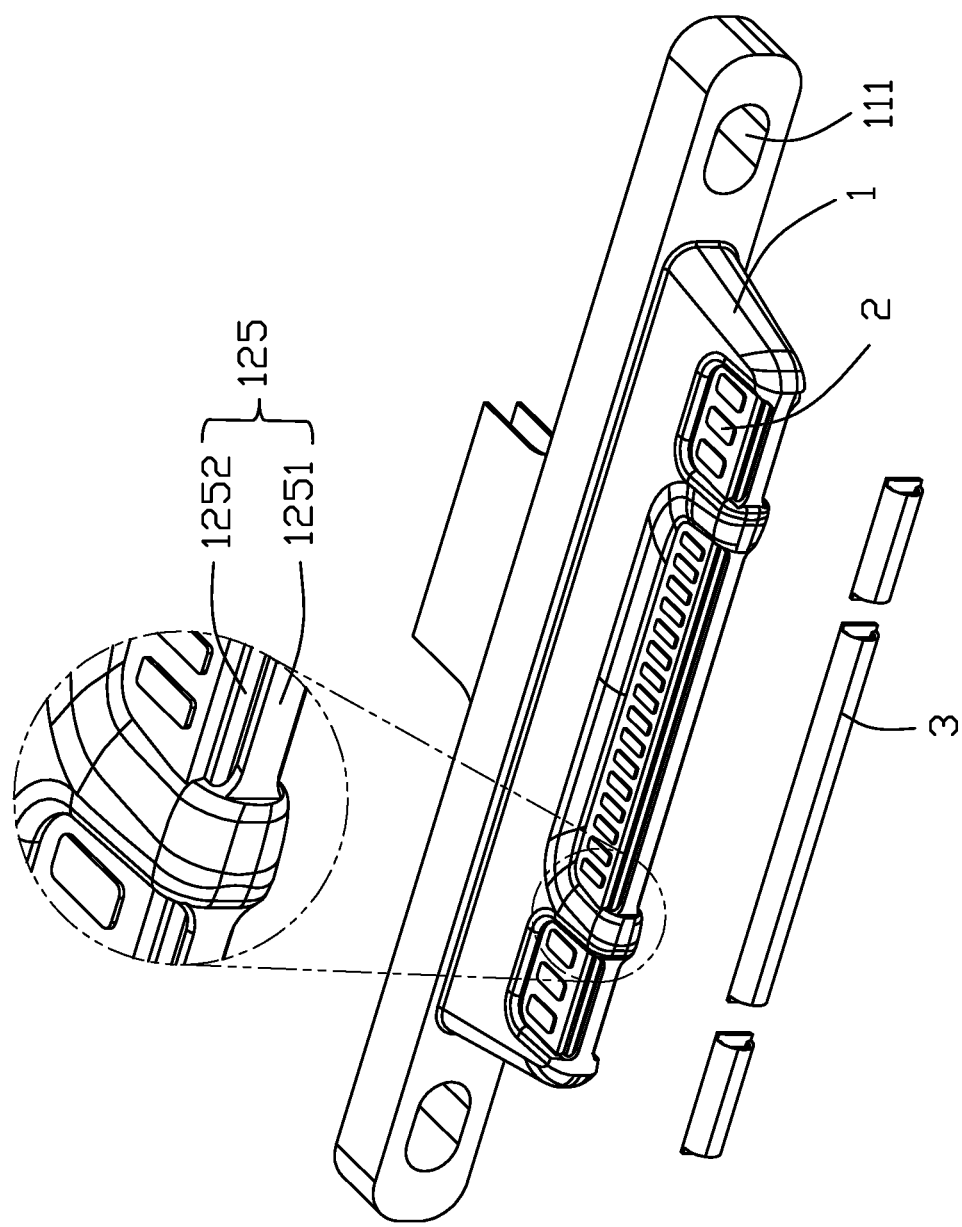
FIG. 2 is an exploded perspective view of the electrical connector of FIG. 1.
Figure 3:
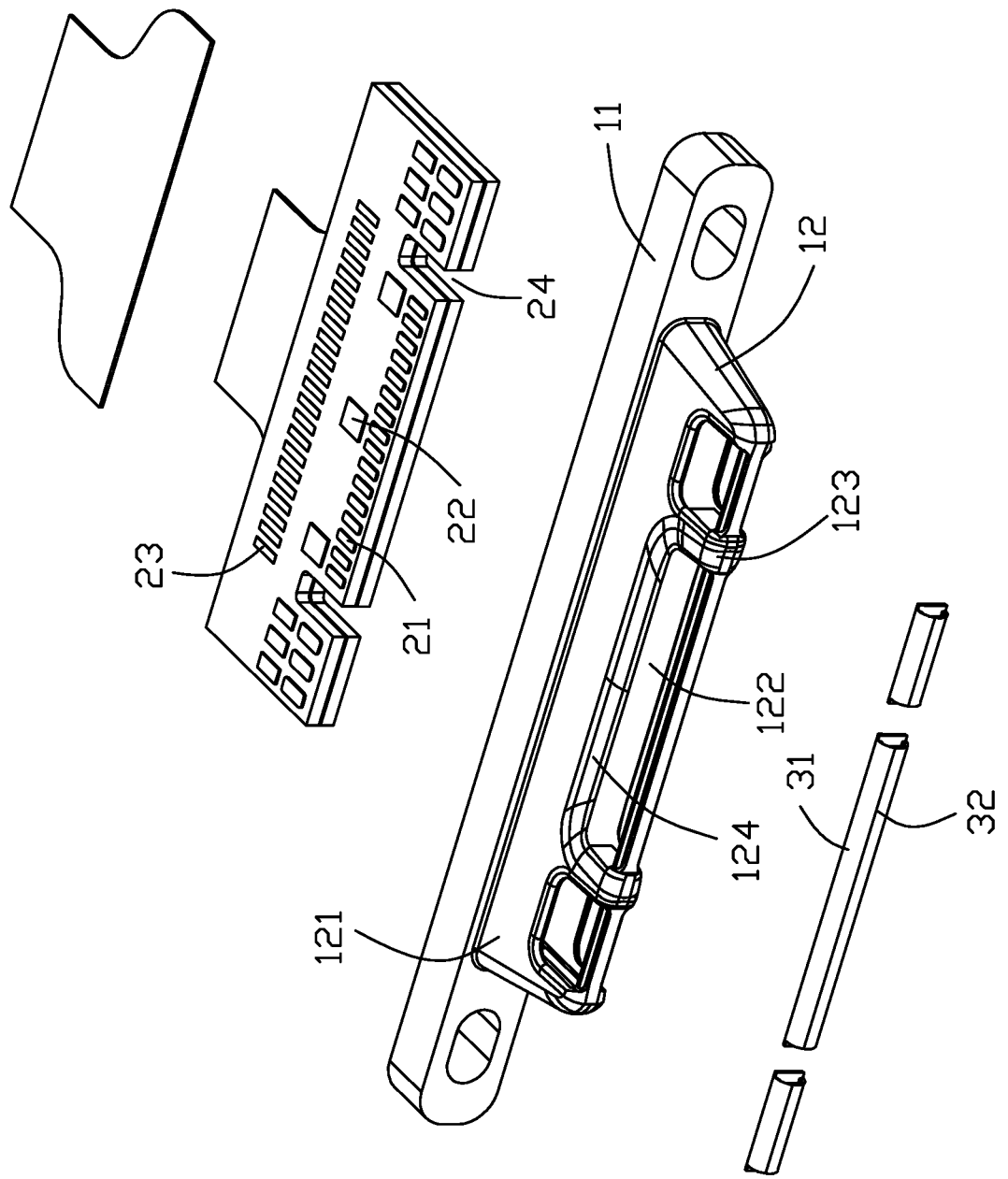
FIG. 3 is a further exploded perspective view of the electrical connector of FIG. 1.
Figure 4:
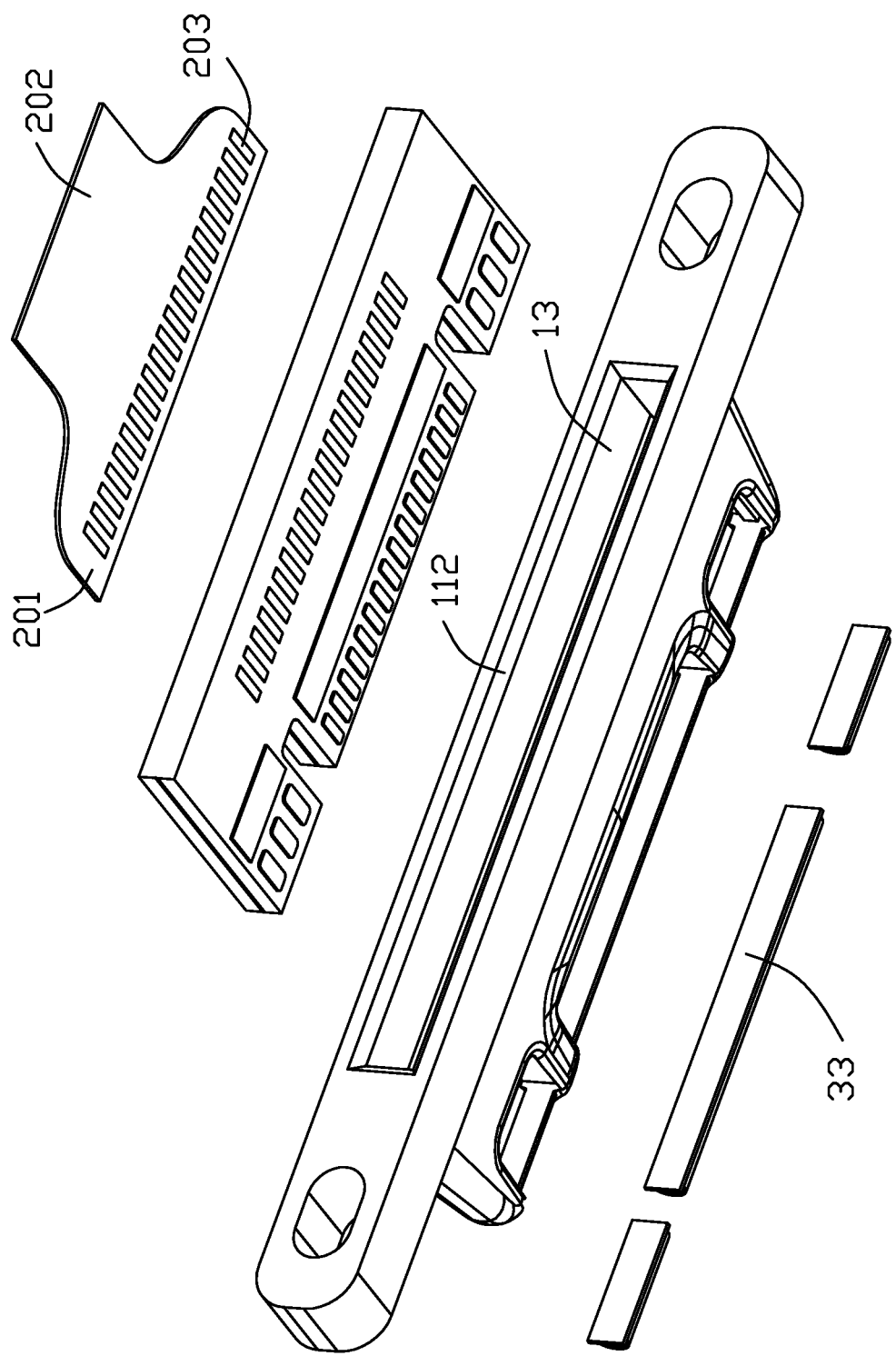
FIG. 4 is another further exploded perspective view of the electrical connector of FIG. 3.
Figure 5:
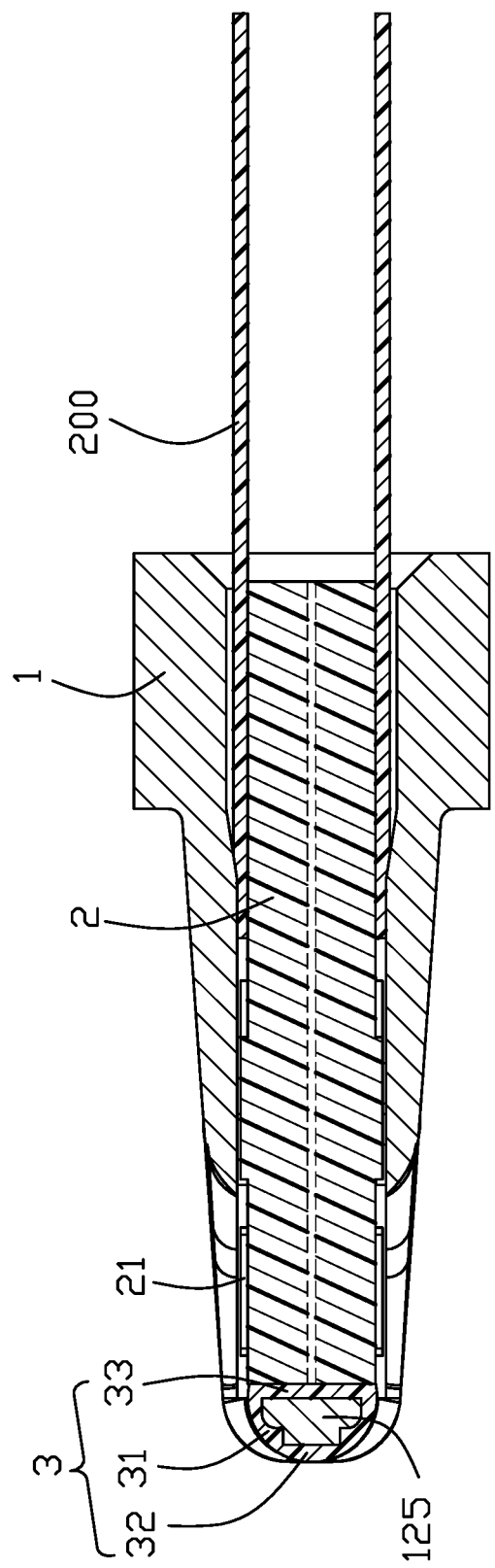
FIG. 5 is a cross-sectional view of the electrical connector of FIG. 1.
Figure 6:
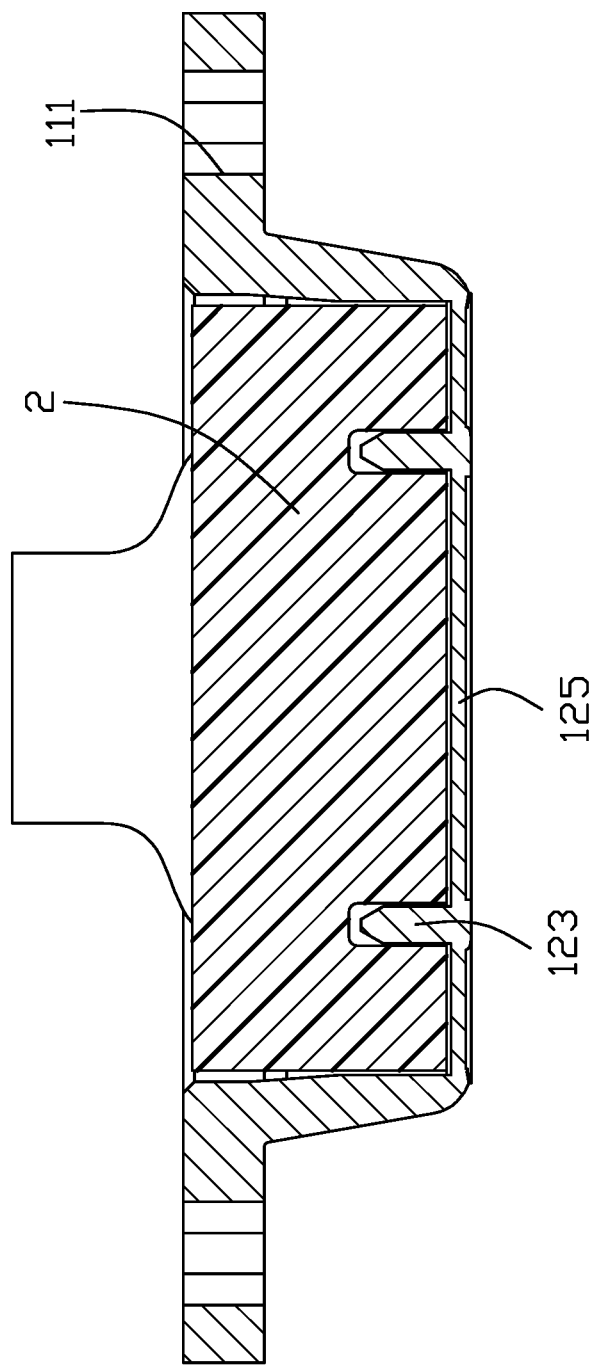
FIG. 6 is another cross-sectional view of the electrical connector of FIG. 1.

Reference will now be made in detail to the embodiment of the present disclosure.

An electrical connector assembly 1000 includes an electrical connector 100 and a pair of FPCs 200 connected to the connector 100. The connector 100 includes a metallic shell 1, a PCB 2 received within the shell 1, and an insulative bar 3 attached upon a front edge of the shell 1. The FPC 200 includes a connection region 201 having a plurality of conductive pads 203 thereon, and an extension region 202 extending rearwardly from the connection region 201.

The shell 1 is made from MIM (Metal Injection Molding), and includes a base 11, and a tongue section 12 extending forwardly from the base 11 along a front-to-back direction, and a receiving space 13 extending forwardly from the base 11 into tongue section 12. The base 11 forms a pair of mounting holes 111. The base 11 forms a chamfered structure 112 around an opening of the receiving space 13 for facilitating insertion of the PCB 2 into the receiving space 13 from a rear side of the shell 11. The tongue section 12 forms a pair of mating faces 121 opposite to each other in a vertical direction perpendicular to the front-to-back direction. Each mating face 121 forms three openings 122 communicating with the receiving space 13. A rib 123 is formed between every adjacent two openings 122 along a transverse direction perpendicular to both the front-to-back direction and the vertical direction, and connect the opposite mating faces 121 and extend into the receiving space 13. A tapered face 124 is formed on the tongue section 12 around the opening 122 so as to guide the mating connector (not shown) during mating. The shell 1 includes a transverse bar 125 on the front edge so as to veil the corresponding openings 122 in the front-to-back direction. The transverse bar 125 includes a main body 1251 and a pair of recesses 1252 respectively located by two sides of the main body 1251 and spaced from each other in the vertical direction.

The PCB 2 is received within the receiving space 13 which essentially includes two layers sandwich a grounding layer (shown in the dashed lines) therebetween in the vertical direction. The PCB 2 includes a plurality of conductive signal pads 21 exposed to an exterior through the corresponding openings 122, a plurality of conductive connecting pads 23 for mechanically and electrically connecting to the conductive pads 203 of the FPCs, and a plurality of conductive grounding pads 22 located between the conductive signal pads 21 and the conductive connecting pads 23 in the front-to-back direction and coated with pastes to be soldered with the shell 1 for securing the PCB 2 and the shell 1 together. The PCB 2 forms a plurality of notches 24 to receive the corresponding ribs 123 therein, respectively, so as to align the PCB 2 within the shell 1. Notably, the grounding pads 22 have different arrangements on the opposite surfaces of the PCB 2 wherein those on one surface forms three straps in the transverse direction for securing to the shell 2.

The insulative bar 3 encloses the transverse bar 125 via insert-molding and includes a front face 32, a pair of curved faces 31 connected to the opposite sides of the front face 32 and a rear face 33 connected to rear sides of the pair of curved faces 31 so as to surround the transverse bar 125 in a cross-sectional view. The front edge of the PCB 2 confronts the rear face 33.

During assembling, the insulative bar 3 is firstly applied upon the shell 1, and the FPCs 200 are soldered upon the PCB 2. The PCB 2 is inserted into the receiving space 13 and secured to the shell via the fixation between the shell 1 and the grounding pads 22. After assembled, the conductive signal pads 21 are exposed to the exterior through the corresponding openings 122 for mating with the mating connector. In this embodiment, because the ribs 123 links both the opposite mating faces 121, an enhanced structure is provided for the tongue section 12.

While preferred embodiments in accordance with the present disclosure have been shown and described, equivalent modifications and changes known to persons skilled in the art according to the spirit of the present disclosure are considered within the scope of the present disclosure as described in the appended claims.

What is claimed is:

1. An electrical connector assembly comprising:
a metallic shell made via a metal injection molding and including a base and a tongue section extending forwardly from the base in a front-to-back direction, two opposite mating faces formed on the tongue section in a vertical direction perpendicular to said front-to-back direction;
a receiving space extending forwardly from a rear end of the base into the tongue section;
a transverse bar formed on a front edge of the tongue section and extending along a transverse direction perpendicular to both the front-to-back direction and the vertical direction;
a plurality of openings formed in each of the mating faces;
a plurality of ribs each formed between the corresponding two adjacent opening in said transverse direction, and linked between the opposite mating faces in the vertical direction, and extending rearwardly from the transverse bar in the front-to-back direction with a distance; and
a printed circuit board (PCB) having in a front edge region a plurality of notches respectively receiving the corresponding ribs, and a plurality of signal pads exposed to an exterior through the corresponding openings, respectively.

2. The electrical connector assembly as claimed in claim 1, wherein the PCB further includes a plurality of grounding pads mechanically and electrically connected to the shell in the vertical direction.

3. The electrical connector assembly as claimed in claim 2, further including at least one flexible printed circuit (FPC) connected to corresponding connecting pads behind the grounding pads on the PCB.

4. The electrical connector assembly as claimed in claim 2, wherein the ribs extend rearwardly beyond the signal pads in the front-to-back direction.

5. The electrical connector assembly as claimed in claim 1, further including an insulative bar extending along said transverse direction and surrounding the transverse bar in a cross-sectional view.

6. The electrical connector assembly as claimed in claim 5, wherein said insulative bar includes a front face, a pair of curved faces respectively located on opposite side of the front face and spaced from each other in the vertical direction, and a rear face connected to rear ends of the pair of curved faces.

7. The electrical connector assembly as claimed in claim 5, wherein said insulative bar is divided into three sections isolated from one another by the shell where the ribs are located.

8. A method of making an electrical connector assembly comprising steps of:
providing a metallic shell by metal injection molding and with a base and a tongue section forwardly extending from the base along a front-to-back direction, and a receiving space extending forwardly from a rear end of the base into the tongue section, wherein said tongue section defines opposite mating faces in a vertical direction perpendicular to said front-to-back direction, a plurality of opening in each of the mating faces, a transverse bar extending along a transverse direction perpendicular to both the front-to-back direction and the vertical direction, and a plurality of ribs each formed between every adjacent two openings in the transverse direction, and connected between the opposite mating faces in the vertical direction, and extending rearwardly from the transverse bar in the front-to-back direction;
providing a printed circuit board (PCB) with a plurality of notches in a front edge region, and a plurality of signal pads on a front region; and
inserting the PCB into the receiving space from a rear side of the base to have the signal pads exposed to an exterior through the corresponding openings in the vertical direction, and the ribs received within the corresponding notches, respectively.

9. The method as claimed in claim 8, further providing a plurality of grounding pads formed on the PCB behind the signal pads in the front-to-back direction, and soldering the shell with the grounding pads in the vertical direction.

10. The method as claimed in claim 9, further including an insulative bar, via an insert-molding process, enclosing the transverse bar in a cross-sectional view along the transverse direction to have a front edge of the PCB forwardly confronts the insulative bar.

11. The method as claimed in claim 10, further providing a flexible printed circuit (FPC) soldered to corresponding connecting pads which are located behind the grounding pads in the front-to-back direction.

12. The method as claimed in claim 10, wherein said insulative bar is divided into three sections by the shell where the ribs are located.

13. An electrical connector comprising:
a metallic shell made via a metal injection molding and including a base and a tongue section extending forwardly from the base in a front-to-back direction, two opposite mating faces formed on the tongue section in a vertical direction perpendicular to said front-to-back direction;
a receiving space extending forwardly from a rear end of the base into the tongue section;
a transverse bar formed on a front edge of the tongue section and extending along a transverse direction perpendicular to both the front-to-back direction and the vertical direction;
a plurality of openings formed in each of the mating faces;
a plurality of ribs each formed between the corresponding two adjacent opening in said transverse direction; and
a printed circuit board (PCB) having in a front edge region a plurality of notches respectively receiving the corresponding ribs, and a plurality of signal pads exposed to an exterior through the corresponding openings, respectively.

14. The electrical connector assembly as claimed in claim 13, wherein each of said ribs is connected to at least either the transverse bar in the front-to-back direction, or one of the mating faces in the vertical direction.

15. The electrical connector assembly as claimed in claim 13, wherein the PCB further includes a plurality of grounding pads mechanically and electrically connected to the shell in the vertical direction.

16. The electrical connector assembly as claimed in claim 15, further including at least one flexible printed circuit (FPC) connected to corresponding connecting pads behind the grounding pads on the PCB.

17. The electrical connector assembly as claimed in claim 15, wherein the ribs extend rearwardly beyond the signal pads in the front-to-back direction.

18. The electrical connector assembly as claimed in claim 13, further including an insulative bar extending along said transverse direction and surrounding the transverse bar in a cross-sectional view.

19. The electrical connector assembly as claimed in claim 18, wherein said insulative bar includes a front face, a pair of curved faces respectively located on opposite side of the front face and spaced from each other in the vertical direction, and a rear face connected to rear ends of the pair of curved faces.

20. The electrical connector assembly as claimed in claim 18, wherein said insulative bar is divided into three sections isolated from one another by the shell where the ribs are located.

* * * * *